United States Patent
Darsow et al.

(10) Patent No.: US 7,962,871 B2
(45) Date of Patent: Jun. 14, 2011

(54) CONCURRENTLY MODELING DELAYS BETWEEN POINTS IN STATIC TIMING ANALYSIS OPERATION

(75) Inventors: Craig M. Darsow, Rochester, MN (US); Timothy D. Helvey, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 385 days.

(21) Appl. No.: 12/126,037

(22) Filed: May 23, 2008

(65) Prior Publication Data

US 2009/0293030 A1 Nov. 26, 2009

(51) Int. Cl.
*G06F 17/50* (2006.01)
*G06F 9/455* (2006.01)

(52) U.S. Cl. ........................ 716/108; 716/113

(58) Field of Classification Search .............. 716/6, 108, 716/113

See application file for complete search history.

(56) References Cited

U.S. PATENT DOCUMENTS

| | | | |
|---|---|---|---|
| 5,210,700 A | 5/1993 | Tom | |
| 7,117,466 B2 | 10/2006 | Kalafala et al. | |
| 7,143,379 B2 | 11/2006 | Darsow et al. | |
| 7,206,958 B1 | 4/2007 | Sutherland et al. | |
| 2002/0116695 A1* | 8/2002 | Bou-Ghazale et al. | 716/6 |
| 2003/0172361 A1 | 9/2003 | Chiu | |
| 2006/0277513 A1* | 12/2006 | Visweswariah | 716/6 |
| 2007/0266355 A1* | 11/2007 | Cha et al. | 716/5 |
| 2008/0141200 A1* | 6/2008 | Mirbeth et al. | 716/6 |
| 2009/0106717 A1 | 4/2009 | Chen et al. | |

OTHER PUBLICATIONS

Non-Final Office Action for U.S. Appl. No. 12/126,053, mail date: Dec. 7, 2010, [16 pp].

* cited by examiner

*Primary Examiner* — Jack Chiang
*Assistant Examiner* — Magid Y Dimyan
(74) *Attorney, Agent, or Firm* — Toler Law Group (57) ABSTRACT

An apparatus, program product and method perform static timing analysis on an integrated circuit design by concurrently modeling a plurality of timing delays associated with a connection between points in the design. The delays are conveyed in multiple clock signals of a single timing run of a static timing analysis operation. Multiple paths comprising logical user defined delay segments are assigned different delays. Only one signal may be permitted to propagate along each path.

18 Claims, 3 Drawing Sheets

CONCURRENTLY MODELING DELAYS BETWEEN POINTS IN STATIC TIMING ANALYSIS OPERATION

RELATED APPLICATIONS

The present application relates to co-pending U.S. patent application Ser. No. 12/126,053, entitled "Replicating Timing Data in Static Timing Analysis Operation" by the present inventors, Timothy D. Helvey and Craig M. Darsow. The co-pending application is filed concurrently herewith, and is incorporated by reference in its entirety.

FIELD OF THE INVENTION

The present invention relates generally to integrated circuits, and more specifically, regards the static timing analysis of integrated circuit designs.

BACKGROUND OF THE INVENTION

The proliferation of modern electronics is due in large part to the development of the integrated circuit. Integrated circuits allow many different circuit elements to be implemented on a single microchip. As technology advances, the number of circuit elements on a microchip continues to increase, which enhances the performance and reduces the cost of integrated circuits.

The design of integrated circuits is typically performed in three stages. The first stage includes logic design, where the desired operation of the integrated circuit is defined. The second stage, logic synthesis, involves translating the desired operation into the required circuit elements for a given technology. The third stage is physical design, which assigns the placement of these elements. Physical design also determines routing, which creates the wire interconnect of these elements on the integrated circuit.

Integrated circuits have traditionally been characterized by the clock frequency at which they operate. Gauging the ability of a circuit to operate at the specified speed requires the ability to measure its delay at numerous steps during the design process. Moreover, delay calculation must be incorporated into the inner loop of timing optimizers at various phases of the design, such as logic synthesis, layout (placement and routing), and in in-place optimizations performed late in the design cycle.

Some logic designs contain complex delay elements whose delay is a function of the state of the logic, rather than just a static value. In a synchronous digital system, data is supposed to move in lockstep, advancing one stage on each tick of the clock signal. This is enforced by synchronizing elements such as flip-flops or latches, which copy their input to their output when instructed to do so by the clock.

Many of the common problems in chip design relate to interface timing between different components of the design. The time when a signal arrives can vary for many reasons. For instance, the input data may vary, and/or the circuit may perform different operations. The temperature and voltage may change, the clock signal may be at an optimized frequency, and/or there may be manufacturing differences in the exact construction of each part. Other problems may stem from the simulation model being incomplete, or there may be a lack of test cases to properly verify interface timing. Synchronization requirements may vary, and/or there may be incorrect interface specifications, among other considerations.

Examples of problems that can occur from poor timing include a hold time violation, when a signal arrives too early and advances one clock cycle before it should. Another problem includes a setup time violation, when a signal arrives too late and misses the time when it should advance.

At the logic synthesis stage of integrated circuit design, a static timing tool is typically used to perform a static timing analysis to compute the expected timing of a digital circuit without requiring simulation. Static timing analysis generally takes into account best-case and worst-case delays of various circuit elements, thereby generating a list of problems that need to be corrected. As such, static timing analysis plays a vital role in facilitating the fast and reasonably accurate measurement of circuit timing.

The main goal of static timing analysis is to verify that despite possible variations, all signals will arrive neither too early nor too late, and hence proper circuit operation can be assured. In static timing analysis, the word static alludes to the fact that the timing analysis is carried out in an input-independent manner, and purports to find the worst-case delay of the circuit over all possible input combinations.

As previously stated, behavior of an electronic circuit is often dependent on various, variable factors in its environment. In such a case, either static timing analysis needs to be performed for more than one such set of conditions, or it must be prepared to work with a range of possible delays for each component, as opposed to a single value. If the design works at each extreme condition, then under the assumption of monotonic behavior, the design is also qualified for all intermediate points.

EinsTimer, developed by International Business Machines Corp. (IBM), uses a statistical engine to apply static timing analysis to critical paths in designs in order to derive models that are more silicon-accurate than most models used in static analysis. The models derived from the EinsTimer tool can then be applied to the rest of the paths in the design, improving the design's overall performance over traditional static timing analysis. Performance gain obtained will depend upon the chip and the length of paths on the chips.

EinsTimer additionally accounts for sources of variation and how the cells in the library have delays that depend on these process parameters. A characterization tool is used that analyzes every cell in the library to understand the sensitivity of cell delays to process. The characterization tool then outputs a modified library file that is used by the statistical tool for analysis. Reports and yield plots are also output in order to help users to better understand their design. For example, users can employ the tool after they have routed their design and created a clock tree in order to understand sensitivity to metal issues and transistor parameters. This feature provides designers with an idea of how robust their design is, and thus, what kind of yield to expect on a particular design. The design can then be modified to improve these timing characteristics prior to tapeout.

While the EinsTimer and other static timing analysis tools provide valuable information and are useful in the design of integrated circuits, these processes currently require significant amounts of processing and memory resources. An analyst must setup and execute separate timing runs accounting for each variable in an operation. For instance, a separate timing run must be accomplished for each potential delay associated with an arriving signal of interest. Conventional practices also consume a considerable amount of the designer man-hours associated with analyzing the result of each timing run.

Therefore, what is needed is a way to analyze timing runs that minimizes the computing resources, time or money costs conventionally associated with static timing analysis.

SUMMARY OF THE INVENTION

The present invention provides an improved computer implemented method, apparatus and program product for conducting static timing analysis on an integrated circuit design by concurrently generating multiple signals having different delays within a single timing run of a static timing analysis operation associated with points of an integrated circuit design, and using the signals to conduct the static timing analysis. Embodiments consistent with the invention may create multiple logical paths respectively associated with the multiple delays.

According to one aspect of the invention, all but one of the signals may be prevented from propagating along one of the multiple logical paths. The paths may include user defined delay segments associated with the delay. The user defined delay segment may be logically connected to a user defined timing point.

An embodiment consistent with the invention may associate a delay of the multiple delays with the user defined delay segment. Where so desired, no delay may be assigned to the user defined delay segment.

According to another aspect of the invention, another user defined delay segment may be associated with the user defined timing point. Another delay of the multiple delays may be associated with the other user defined delay segment. In one embodiment, more than two signals may be concurrently modeled.

These and other advantages and features that characterize the invention are set forth in the claims annexed hereto and forming a further part hereof. However, for a better understanding of the invention, and of the advantages and objectives attained through its use, reference should be made to the Drawings and to the accompanying descriptive matter in which there are described exemplary embodiments of the invention.

DETAILED DESCRIPTION

Embodiments consistent with the underlying principles of the present invention concurrently model a plurality of timing delays associated with a connection between points on a circuit. The timing delays are conveyed in multiple clock signals of a single timing run of a static timing analysis operation. Multiple paths comprising logical user defined delay segments are assigned different delays. Only one signal may be permitted to propagate along each path. That is, different timing delays conveyed in multiple clock signals may be concurrently propagated for a path between points and within a single timing run of a static timing analysis tool.

In one embodiment, an analyst may want to program a 250 picosecond delay into a delay chain associated with mode of operation and path. In another mode, the analyst may desire to see the effects of a 500 picosecond delay. As such, aspects of the invention may allow fast and slow mode clock signals within a single timing run of a static timing analysis procedure. For purposes of this specification, a clock signal may comprise a signal that includes timing data. The two different delay values associated with the fast and slow clock signals may be associated with a physical path of an integrated circuit. A system may model two or more modes for the design and determine corresponding arrival times and slacks for the different modes that the design may experience.

Embodiments consistent with the underlying principals of the present invention may allow better and more efficient use of resources. Instead of running two separate and different analyses, the system may accomplish multiple analyses for multiple time delays concurrently propagated during a single timing run. A timing run may coincide with signal propagation through and output from a timing analysis tool during static timing analysis. Economies and other synergies realized using processes consistent with the present invention may include using relatively half the processing and memory resources, while drastically reducing man-hours required for analysis. Instead of producing two result statistics over the period of two timing runs, such analysis may be merged advantageously in the output of a single timing run. This feature reduces the workload of an integrated circuit designer.

Concurrent processes may include simultaneous operations or processes otherwise occurring within the span of a single static timing analysis timing run. Embodiments may preserve transition and arrival times, including early, late and uncertainty information associated with the clock signals. Times and slews are typically and advantageously preserved.

As discussed herein, static timing analysis tools offer a mechanism to permit users to create arbitrary paths and set arbitrary delays on these paths using user scripts. This mechanism may be referred to as a user defined delay segment (UDDS). UDDSs may be used to override delay values normally provided by timing rules, or to create non-physical paths that model something outside the timing rules. The same clock, or phase, is applied to any signal processed through the UDDS. Thus, separate timing runs and new UDDSs are needed to model different delays between the same two points of interest. A new value must be set for each new UDDS that is desired for each of the clocks of interest. Separate analysis is also required for each timing run. Because the separate timing runs each require substantial computing resources, the inability to make these UDDSs handle several different delays in the same run negatively impacts the schedule, cost, or availability of computing resources, all of which can be significant problems.

Related to the UDDSs, static timing analysis tools consistent with embodiments of the invention may include a user defined timing point (UDTP). UDTPs enable users to create arbitrary, logical points that may serve as starting or ending points for UDDSs. UDTPs may be executed at any timing operation, such as timing assertions, in similar fashion to automatically created timing points that correspond to physical locations within the design.

Embodiments consistent with the invention may use the UDTPs in conjunction with the UDDSs and specific timing assertions to accomplish analyses for several or more different delay values within a single timing run. This process contrasts accomplishing several, separate timing runs to obtain data between the points over a UDDS. Only one timing analysis run needs to be executed in accordance with aspects of the present invention, as opposed to several, to obtain the same resulting information. This efficiency leads to improved computing resource usage and quicker results.

Embodiments consistent with the invention may use dummy commands associated with the command language of specific static timing analysis tools. While some embodiments described herein regard accomplishing two different delays between the same two pins, others may include significantly larger numbers of delays within the same static timing analysis run. Such numbers may be achieved by replicating steps described below.

In one example, an integrated circuit design may include two physical points represented in the timing model of the timing tool. The points may be named Physical_SOURCE and Physical_SINK. It may be desired that the static timing analysis show results for two different modes of operation. The first mode may include a delay of X between the points. The other mode may include a delay of Y between the points. Two clocks, CLOCK_FOR_X and CLOCK_FOR_Y, are associated with the effects of these two delays. The arrival times associated with both of these clocks may be communicated to a pin, Physical_SOURCE.

Creation of a simple UDDS between pins, Physical_SOURCE and Physical_SINK, would allow only the delay value X or the delay value Y to be applied. The result would be limited to one or the other of values X or Y added as signals propagated through the UDDS. Aspects of the invention improve upon this scenario by allowing multiple delays to be concurrently run in a timing run.

In one embodiment, a new UDTP may be created. For example, a UDTP may be generated and named, "UDTP_FOR_X". Two UDDSs may be created. A first may logically connect Physical_SOURCE to UDTP_FOR_X. This first UDDS may be assigned a delay of zero. Another UDDS extending from UDTP_FOR_X to Physical_SINK may have a delay value of X.

A programmatic assertion may be made to remove all evidence of CLOCK_FOR_Y at the UDTP, which is connected to the UDDS that has delay X on it. For instance, the command may read, "Dont_Care clock CLOCK_FOR_Y at UDTP_FOR_X". The command may result in only CLOCK_FOR_X existing at UDTP_FOR_X. As such, only CLOCK_FOR_X will propagate down the UDDS between UDTP_FOR_X and Physical_SINK, at which the arriving delay will be X.

A new UDTP may be generated and called, "UDTP_FOR_Y". Two UDDSs may accordingly be created. One UDDS connecting Physical_SOURCE to UDTP_FOR_Y may have a delay of zero. Another UDDS extending from UDTP_FOR_Y to Physical_SINK may have a delay value of Y. As above, an assertion to remove all evidence of CLOCK_FOR_X at the UDTP may be made, "Dont_Care clock CLOCK_FOR_X at UDTP_FOR_Y". As a result, only CLOCK_FOR_Y will exist at UDTP_FOR_Y. Accordingly, only CLOCK_FOR_Y will propagate down the UDDS between UDTP_FOR_Y and Physical_SINK, at which the delay is Y. Any number of additional delays may be added by repeating the above processes.

As discussed herein, the logic design of a circuit is evaluated in static timing analysis to identify timing problems in the design. The logic design may be analyzed by propagating cumulative path delays from the inputs of the circuit to its outputs in a single pass, or run. The delay may comprise the time it takes for a signal to travel between first and second points, which may correspond to an element(s) of a circuit. A timing problem may be indicated at a point in the circuit which joins two circuit paths when the signal along one of the paths arrives at the point with an improper timing relationship to the signal along the second path.

Static timing analysis thus concerns a point-by-point analysis of a logic circuit in which all possible paths to the current point are analyzed to detect timing problems. This is contrasted with dynamic timing analysis, in which logic circuit operation is simulated. Static timing analysis proceeds by propagating maximum delays from the inputs to the outputs of a design in a single pass through the design. Assuming that the design includes clocked elements such as latches, the single pass analysis means that such elements would be clocked only once during the analysis. Latches are used commonly in many various types of integrated circuits for the temporary storage of signals between circuit elements and for interfacing to external circuitry. Latches are transparent when open, and latch the data when closed.

If data is generated at the output pin of the clocked element, or source element, later than it is expected to be clocked into the input pin of the next downstream clocked element, or sink element, the data will appear to be too late from the standpoint of the sink latch. This anomaly is resolved by making a timing adjustment to the delay value that is propagated out of the output pin of the source latch. For instance, a clock cycle may be subtracted from the delay value.

Figure 1:
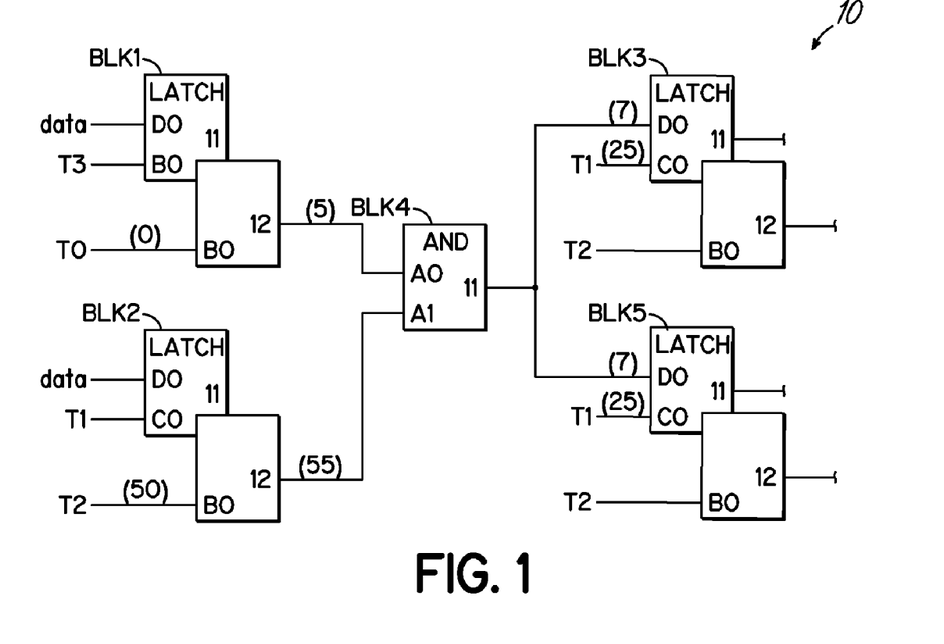
FIG. 1 is a representation of an integrated circuit design for purposes of illustrating static timing analysis processes consistent with the principles of the present invention.

An example of how timing adjustments are made within a static timing analysis environment is shown in FIG. 1. FIG. 1 illustrates a logic circuit design 10 consisting of a plurality of circuit components, or blocks. Each block represents a particular kind of logic element and includes one or more input ports on its left-hand side, and one or more output ports on its right-hand side.

Two exemplary circuit components are illustrated in FIG. 1. Blocks (BLKS) 1, 2, 3 and 5 are clocked circuit components, e.g., latches. Each latch may include two elements. The first element may comprise a data input pin D0, a clock input pin C0 and an output pin 11. The second element has a data input internally connected to the first element, and uses the B0 input pin for clocking into the second element. Each latch may be fed a clock signal consisting of two clock waveforms. Data presented to the D0 input enters the first element while the clock input to the C0 input pin has a positive level. The data is latched or retained in the first element at the rising edge of the clock input to the C0 pin. The data in the second element is thus available as the output at the next rising edge of the clock waveform at the B0 input pin. In FIG. 1, block 4 represents an AND gate with two input pins A0, A1 and a single output pin 11.

Figure 2:
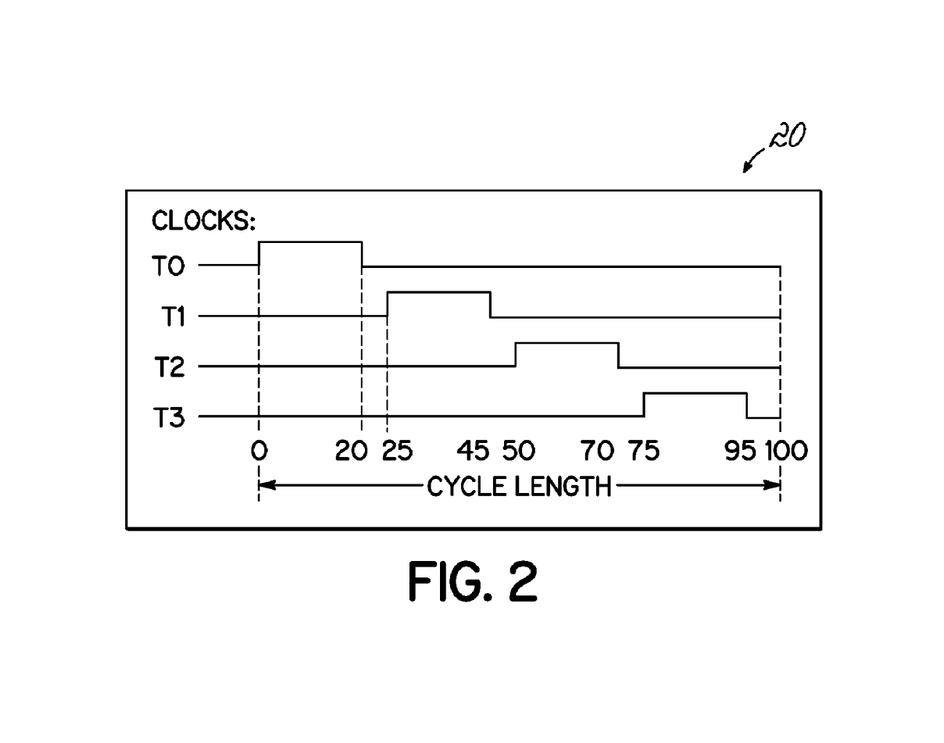
FIG. 2 is a set of clock waveforms illustrating a multi-phase clock 20 that synchronizes operations of clocked elements of the integrated circuit design illustrated in FIG. 1.

The logic design of FIG. 1 employs multi-phase system clocking in which the operations of clocked components are controlled by a plurality of clock signals. Such clock signals are illustrated in FIG. 2. The clock signals are interlaced in that they have the same frequency, but separate, respective phases. FIG. 2 illustrates four clocks T0, T1, T2, and T3. One system clock cycle of the logic design of FIG. 1 comprises an interlaced sequence of four staggered clock pulses, one from each of the respective clock signals T0-T3. The cycle length is 100 timing units. Each clock signal has a pulse width of 20 timing units from rising to falling edge. As shown, the falling edge of each clock signal is separated from the rising edge of the next clock signal by five timing units.

In terms of FIG. 1, one goal of static timing analysis is to determine whether any timing problems exist between a data signal input to the input pin D0 of block 3 and the T1 clock input to the C0 input of the block. The analysis regards the arrival time of a signal produced from the output pin of block 4 with respect to the occurrence of the rising edge of the T1 clock. If the arrival time of the data signal precedes the rising edge of the T1 clock, the signal will be latched. Otherwise, the rising edge of the T1 will latch an incorrect signal into the block. The output pin of block 4 produces the signal in response to signals produced by block 1 and block 2. Each of these signals has respective delay characteristics, and either can affect the output of block 4. Therefore, the timing analysis with respect to block 3 must take into consideration the fact that the output of block 4 can change at different times, depending upon the outputs of blocks 1 and 2.

Figure 3:
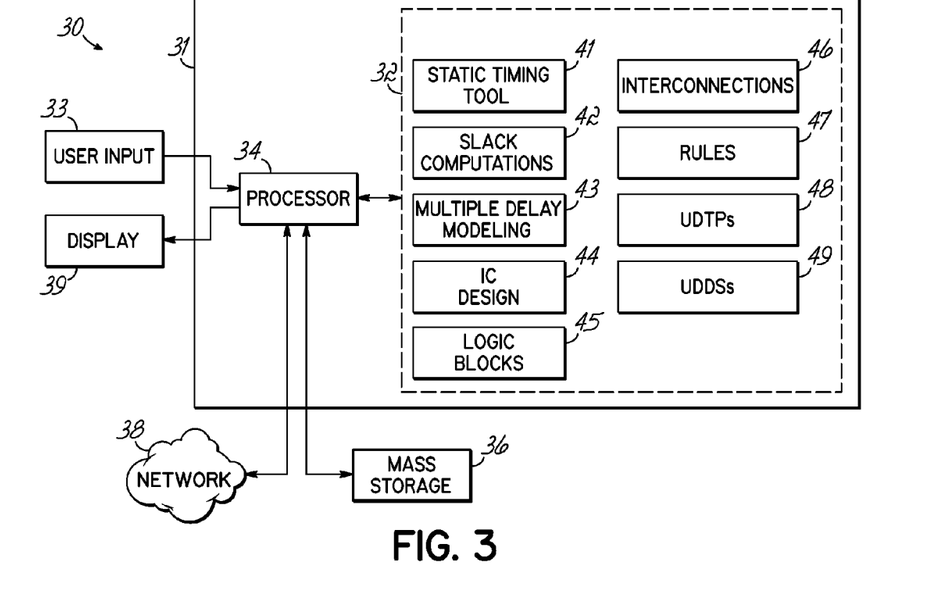
FIG. 3 is a block diagram of a networked computer system configured to concurrently model a plurality of signals having varying delays within the span of a single static analysis timing run.

While the principles of this invention do not limit its forum or application, one desirable concurrent delay modeling embodiment capitalizes on the structure available through the system exemplified in FIG. 3. FIG. 3 generally shows a block diagram of a networked computer system 30 configured to concurrently model a plurality of signals having varying delays within the span of a single static analysis timing run. One such system may include an IBM Server i computer system. Those skilled in the art, however, will appreciate that the mechanisms and apparatus of the present invention apply equally to virtually any other computer system.

The system 30 more particularly comprises one or more client computers 31 coupled to a network 38. Network 38 represents a networked interconnection including, but not limited to local area, wide area, wireless, and public networks (e.g., the Internet). Moreover, any number of computers and other devices may be networked through network 38, e.g., multiple servers.

Computer system 30 will hereinafter also be referred to as an "apparatus," "computer," "tool," "device," or "system," although it should be appreciated that the terms may respectively include many other controller configurations. Moreover, while only one network interface device is shown in FIG. 1, any number of computers and other devices may be networked through network 38. In still another embodiment, the system 30 may be implemented in a standalone configuration, i.e., disconnected from another computer or computer network.

Computer device 31 typically includes at least one processor 34 coupled to a memory 32. Processor 34 may represent one or more processors (e.g., central processing units, microprocessors). Memory 32 may represent the SRAM devices comprising the main storage 32 of computer device 31, as well as any supplemental levels of memory, e.g., cache memories, non-volatile or backup memories (e.g., programmable or flash memories), read-only memories, etc. In addition, memory 32 may be considered to include memory storage physically located elsewhere in computer device 31, e.g., any cache memory present in processor 34, as well as any storage capacity used as a virtual memory, e.g., as stored within a database 37, or on another computer coupled to computer device 31 via network 38.

Computer device 31 also may receive a number of inputs and outputs for communicating information externally. For interface with a user, the computer system 30 typically includes one or more input devices 33 (e.g., a keyboard, a mouse, a trackball, a joystick, a touch pad, iris/fingerprint scanner, and/or a microphone, among others). The computer system 30 additionally includes a display 39 (e.g., a CRT monitor, an LCD display panel, and/or a speaker, among others). It should be appreciated, however, that with some implementations of the computer system 30, direct user input and output may be unsupported by the computer device 31, and interface with the server computer device 31 may be implemented through a computer or workstation networked with the computer device 31.

For additional storage, computer system 30 may also include one or more mass storage devices 36 configured to store, for instance, the database 37. Exemplary devices 36 can include: a floppy or other removable disk drive, a flash drive, a hard disk drive, a direct access storage device (DASD), an optical drive (e.g., a CD drive, a DVD drive, etc.), and/or a tape drive, among others. Furthermore, computer system 30 may include an interface with one or more networks (e.g., a LAN, a WAN, a wireless network, and/or the Internet, among others) to permit the communication of information with other computers coupled to the network 38. It should be appreciated that computer system 30 typically includes suitable analog and/or digital interfaces between processor 34 and each of components 32, 33, 36, 38 and 39.

Computer device 31 may operate under the control of an operating system 40, and executes various computer software and hardware applications, components, programs, modules, e.g., a main memory storage 36, a static timing tool 41, a slack computations algorithm 42, a concurrent multiple delay modeling algorithm 43 and an integrated circuit design 44. An integrated circuit design 44 suitably includes or otherwise accesses logic blocks 45, interconnections 46 and rules 47. UDTPs and UDDSs are represented at blocks 48 and 49, respectively.

The logic blocks 45 may comprise basic building blocks that include transistor structures that define circuit components, such as gates and latches. The interconnections 46 may include the connections between the logic blocks 45. The rules 47 may define the performance for the integrated circuit design, and are based on the selected technology for the integrated circuit. The rules 47 may suitably specify the size of a logic block, and the best-case and worst-case delay characteristics of signals within the logic blocks and between logic blocks.

The static timing tool 41 may perform static timing analysis on an integrated circuit design 44. The static timing tool 41 may perform a plurality of slack computations 42 that define whether there is a timing problem for data setup between pins on a logic block in the integrated circuit design. Slack is a non-negative number if the data setup time is satisfied, with the value indicating how much play, or slack, exists before the timing is violated. If slack is zero, the data setup time is satisfied, but just barely. If slack is negative, the data setup time is not satisfied, and the value indicates how bad the problem is. For example, a slack value of negative four indicates that, under worst-case timing assumptions for data setup time, the clock could occur four time units before the data is guaranteed to be valid.

The operating system 40 may comprise a multitasking operating system, such as OS/400, AIX, or Linux; however, those skilled in the art will appreciate that the spirit and scope of the present invention is not limited to any one operating system. Any suitable operating system may be used.

The computer system 30 utilizes well known virtual addressing mechanisms that allow the programs of computer system 30 to behave as if they only have access to a large, single storage entity instead of access to multiple, smaller storage entities such as main memory 32 and mass storage 36. Therefore, while the operating system 40, static timing tool 41, slack computations algorithm 42, concurrent multiple delay modeling algorithm 43, integrated circuit design 44, logic blocks 45, interconnections 46 and rules 47 are shown to reside in main memory 120, those skilled in the art will recognize that these items are not necessarily all completely contained in main memory 32 at the same time, or at all. It should also be noted that the term "memory" is used herein to generically refer to the entire virtual memory of computer system 30.

Various applications, components, programs, markers, modules, etc. may also execute and/or be stored on one or more processors and/or memory of another computer coupled to computer device 31 via a network 38, e.g., in a distributed or client-server computing environment, whereby the processing required to implement the functions of a computer program may be allocated to multiple computers over a network.

Moreover, while computer device 31 may include a networked computer device, other embodiments of the device 31 may include relatively smaller and more focused computing applications or components, such as a cellular phone, a PDA or a microchip.

In one embodiment, the computer system 30 may comprise a static timing analysis tool, such as IBM's EinsTimer. The system 30 may thus automatically analyze the timing of an integrated circuit design at each node in a design 10. In one implementation, the system 30 may generate slack computations in an integrated circuit design 10, such as shown in FIG. 1. The system 30 may then determine which logic blocks in the integrated circuit design 10 have data launch and clock test signals on the same edge. The system 30 may identify a set of common blocks through which both clock test and data launch signals pass. The system 30 may then compute the difference between the slowest and fastest delay through the common blocks. A negative number on the slack indicates a timing problem, because the clock can conceivably occur under best-case timing assumptions when the data is not yet present under worst-case timing assumptions. The slack may be adjusted by the difference computed.

In general, the routines executed to implement the embodiments of the invention, whether implemented in hardware, as part of an operating system, or as a specific application, component, program, engine, process, programmatic tool, object, module or sequence of instructions, or even a subset thereof, may be referred to herein as an "algorithm," "function," "program code," or simply "program." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. One of skill in the art should appreciate that embodiments consistent with the principles of the present invention may nonetheless use program code resident at only one, or any number of locations.

Moreover, while the invention has and hereinafter will be described in the context of fully functioning computer systems, those skilled in the art will appreciate that the various embodiments of the invention are capable of being distributed as a program product in a variety of forms, and that the invention applies equally regardless of the particular type of computer readable, signal bearing media used to actually carry out the distribution. Examples of signal bearing, computer readable media include, but are not limited to tangible, recordable type media such as volatile and non-volatile memory devices, floppy and other removable disks, hard disk drives, magnetic tape, optical disks (e.g., CD-ROMs, DVDs, etc.), among others, and transmission type media such as digital and analog communication links.

In addition, various program code described hereinafter may be identified based upon the application or engine within which it is implemented in a specific embodiment of the invention. However, it should be appreciated that any particular program nomenclature that follows is used merely for convenience, and thus the invention should not be limited to use solely in any specific application or engine identified and/or implied by such nomenclature.

Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

The various software components and resources illustrated in FIG. 1 may be implemented in a number of manners, including using various computer software applications, routines, components, programs, objects, modules, data structures and programs. Those skilled in the art will further recognize that the exemplary environments illustrated in FIG. 1 are not intended to limit the present invention. Indeed, those skilled in the art will recognize that other alternative hardware and/or software environments may be used without departing from the scope of the invention.

Figure 4:
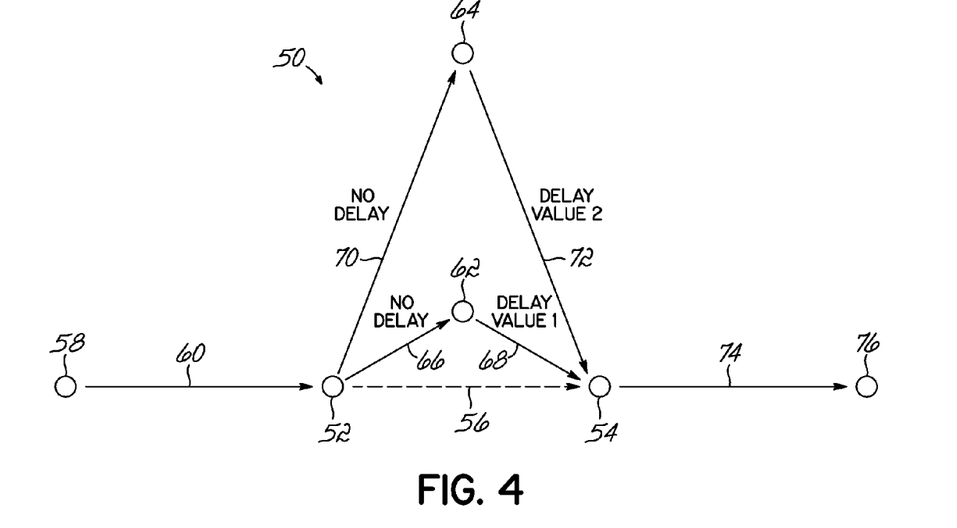
FIG. 4 is a graphical representation of a process for concurrently modeling multiple delays within a single timing run of a static timing analysis in accordance with the underlying principals of the present invention.

FIG. 4 shows a graphical representation of a process for concurrently modeling multiple delays within a single timing run of a static timing analysis in accordance with the underlying principals of the present invention. The representation 50 more particularly shows both a physical source point 52 and a physical sink point 54 of a design. A physical path between the points 52, 54, which may correspond to actual points on an integrated circuit, is represented in FIG. 4 by a dashed line 56. A clock source point 58 shown in the representation 50 feeds a number of clock signals to point 52 over line 60.

The representation 50 also includes first and second UDTPs 62, 64, respectively. As discussed herein, a UDTP may include a point in a design where arrival times and required arrival times can be stored. Such arrival times may comprise inputs to the static timing analysis. UDDSs may include user specifying delays between two points in a design.

A physical source point 52 connects to the first UDTP 62 via a UDDS 66. As discussed herein, such segments typically include a user specified delay that may model a portion of delaying that may be associated with an actual delay and an integrated circuit. In the embodiment of FIG. 4, however, the UDDS 66 may have zero delay associated with it. UDTP 62 may logically connect to the physical sink point 54 via a UDDS 68. The UDDS 68 may be associated with a first delay value. As such, the first delay value may be realized at the physical sink point 54 during a timing run of the static timing analysis.

To prevent other clock signals from propagating from UDTP 62 to physical sink point 54, a system 30 may pragmatically prohibit all other clocks at UDTP 62. For instance, a programmer may input a "don't_care clock" command. The command may be associated with one or more clock signals, not including a clock signal intended to propagate to the physical sink point 54. That clock signal may be communicated from physical sink point 54 to an analysis point 76 via logical line 74. In this manner, the logical route comprising points 52, 62, 54 and segments 66, 68 may correspond to a first delay desired to be modeled in association with a physical path of an integrated circuit undergoing static timing analysis.

Aspects of the invention may concurrently model a second delay value in the same static timing analysis timing run using UDTP 64 and associated UDDSs 70, 72. More particularly, a UDDS 70 may logically connect the physical source point 52 to the UDTP 64. As with the first segment associated with the first delaying, the UDDS 70 may be assigned a zero delay.

UDDS 72, which logically connects the UDTP 64 to the physical sink point 54, may be assigned a second delay value. For instance, the second delay value may be 500 picoseconds. The first delay may be 250 picoseconds. Programming may prevent at UDTP 64 the propagation of all but one desired clock signal. As such, a clock signal having the second desired delay value may arrive over UDDS 72 at the physical sink point 54. Notably, this second delay may arrive concurrently with the first delay communicated over UDDS 68. Both the first and second delay values may be communicated to point 76 for analysis.

Figure 5:
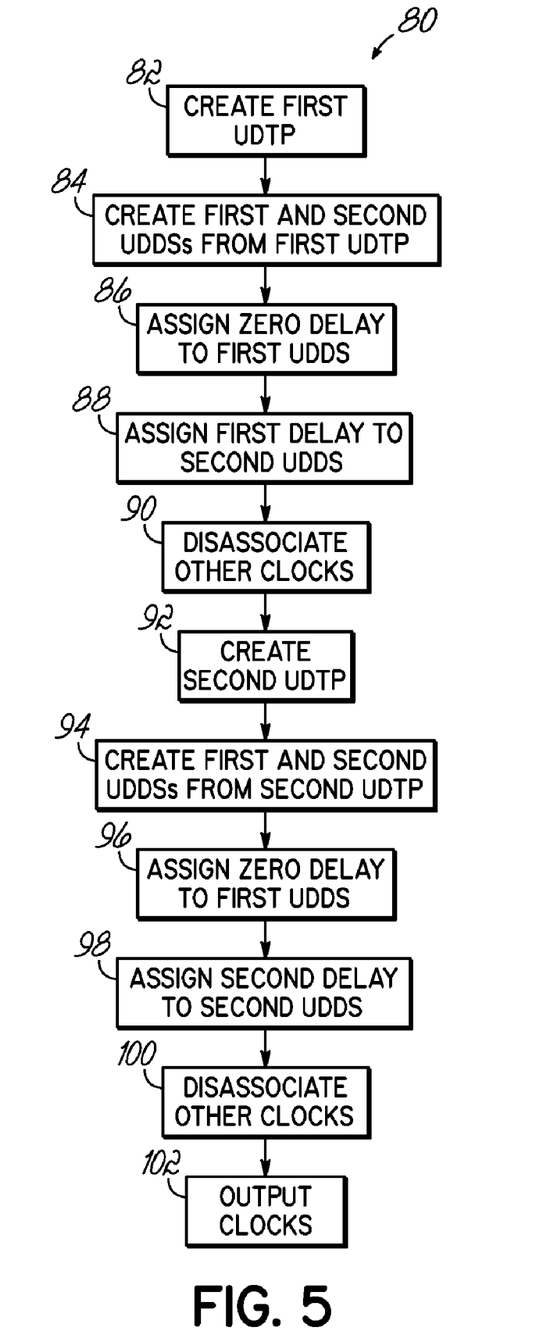
FIG. 5 is a flowchart having steps executable by the system of FIG. 3 for concurrently modeling multiple delays within a single static timing analysis timing run.

FIG. 5 shows a flowchart 80 having steps executable by the system 30 for concurrently modeling multiple delays in a single static timing analysis timing run. Turning more particularly to the flowchart 80, system 30 may receive user input to create at block 82 a first UDTP 62. As discussed herein, the UDTP 62 may comprise a required arrival time and an actual arrival time.

At block 84 of FIG. 5, the system 30 may create with user input the first and second UDDSs 66, 68, respectively associated with the first UDTP 62. The system 30 may assign at block 86 a zero delay to the first UDDS 66. A first delay may be assigned at block 88 to the second UDDS 68. One skilled in the art will appreciate that while no delay is assigned to the UDDS 66 in FIG. 5, another embodiment may assign a delay value to a first segment, and may assign a second or no delay value to a second segment of a logical delay path.

At block 90 of FIG. 5, the system 30 may prevent or otherwise disassociate the propagation of other clocks. By preventing other clocks from being modeled using the first delay value, system 30 may achieve a single instance of the first delay value, while having additional clock signals available to model other delay values.

The system 30 may create at block 92 the second UDTP 64. Accordingly, the system 30 may create first and second UDDSs 70, 72, respectively, stemming from the second UDTP 64 at block 94. System 30 may assign at block 96 a zero delay to the first UDDS 70, and a second delay value to the second UDDS at block 98.

All other clocks but the desired clock signal may be eliminated or otherwise disassociated at block 100. Disassociating may include preventing propagation, and/or excluding consideration of signal propagation in terms of static timing analysis. System 30 may then output clock signals at block 102. The output clocks may include clocks having different delays that are generated during the same timing run of the static timing analysis.

While the present invention has been illustrated by a description of various embodiments and while these embodiments have been described in considerable detail, it is not the intention of the Applicants to restrict, or, in any way limit the scope of the appended claims to such detail. The invention in its broader aspects is therefore not limited to the specific details, representative apparatus and method, and illustrative example shown and described. Accordingly, departures may be made from such details without departing from the spirit or scope of Applicants' general inventive concept.

What is claimed is:

1. A method comprising:
using a computer to conduct a static timing analysis on an integrated circuit design,
wherein conducting the static timing analysis includes:
deteimining a first point and a second point of a plurality of points in the integrated circuit design;
generating a plurality of signals having different delays, wherein a first signal of the plurality of signals has a first delay, and wherein a second signal of the plurality of signals has a second delay that is different from the first delay;
creating a plurality of logical paths between the first point and the second point of the integrated circuit design;
associating the first signal with a first logical path of the plurality of logical paths;
associating the second signal with a second logical path of the plurality of logical paths; and
within a single static timing run, concurrently propagating the first signal that has the first delay from the first point to the second point via the first logical path and the second signal that has the second delay from the first point to the second point via the second logical path.

2. The method of claim 1, wherein conducting the static timing analysis further comprises disassociating all but one of the signals of the plurality of signals from a particular logical path of the plurality of logical paths.

3. The method of claim 1, wherein a particular logical path of the plurality of logical paths includes a user defined delay segment.

4. The method of claim 3, further comprising connecting the user defined delay segment to a user defined timing point.

5. The method of claim 4, further comprising connecting another user defined delay segment to the user defined timing point.

6. The method of claim 5, further comprising associating another delay with the other user defined delay segment.

7. The method of claim 5, further comprising preventing at least one of the plurality of signals from propagating along at least one of the user defined delay segments and the user defined timing point.

8. The method of claim 3, further comprising associating a delay with the user defined delay segment.

9. The method of claim 3, further comprising associating a zero delay with the user defined delay segment.

10. The method of claim 1, wherein generating the plurality of signals further comprises generating a third signal that has a third delay that is different from the first delay and the second delay, the method further comprising:
associating the third signal with a third logical path of the plurality of logical paths; and within the single static timing analysis run, concurrently propagating the third signal having the third delay from the first point to the second point via the third logical path.

11. An apparatus, comprising:
a processor;
a memory in communication with the processor and storing an integrated circuit design; and
program code resident in the memory, the program code configured to:
determine a first point and a second point of a plurality of points in an integrated circuit design;
generate a plurality of signals having different delays, wherein a first sinal of the plurality of signals has a first delay, and wherein a second signal of the plurality of signals has a second delay that is different from the first delay;

create a plurality of logical paths between the first point and the second point of the integrated circuit design;

associate the first signal with a first logical path of the plurality of logical paths;

associate the second signal with a second logical path of the plurality of logical paths; and within a single static timing run, concurrently propagate the first signal that has the first delay from the first point to the second point via the first logical path and the second signal that has the second delay from the first point to the second point via the second logical path.

12. The apparatus of claim 11 wherein the program code is further configured to disassociate all but one of the plurality of signals from a particular logical path of the plurality of logical paths.

13. The apparatus of claim 11, wherein a particular logical path of the plurality of logical paths includes a first user defined delay segment.

14. The apparatus of claim 13, wherein the first user defined delay segment logically connects to a user defined timing point.

15. The apparatus of claim 14, wherein the particular logical path includes the user defined timing point which is logically connected to a second user defined delay segment.

16. The apparatus of claim 13, wherein the program code is further configured to associate a delay of zero with the first user defined delay segment.

17. The apparatus of claim 11, wherein the plurality of signals further includes a third signal having a third delay that is different from the first delay and the second delay, and wherein the third signal is concurrently propagated from the first point to the second point within the single static timing analysis run.

18. A computer program product stored in a non-transitory computer-readable storage medium, the computer program product comprising:

program code configured to:

determine a first point and a second point of a plurality of points in an integrated circuit design;

generate a plurality of signals having different delays, wherein a first signal of the plurality of signals has a first delay, and wherein a second signal of the plurality of signals has a second delay that is different from the first delay;

create a plurality of logical paths between the first point and the second point of the integrated circuit design;

associate the first signal with a first logical path of the plurality of logical paths;

associate the second signal with a second logical path of the plurality of logical paths; and within a single static timing urrentlpropagate the first signal that has the first delay from the first point to the second point via the first logical path and the second signal that has the second delay from the first point to the second point via the second logical path.

* * * * *